(12) United States Patent
Kasajima et al.

(10) Patent No.: US 7,956,602 B2
(45) Date of Patent: Jun. 7, 2011

(54) TILT ANGLE SENSOR AND DETECTION-TARGET DEVICE COMPRISING THE SAME

(75) Inventors: Tamon Kasajima, Hong Kong (CN);
Hiroyoshi Nakajima, Hong Kong (CN);
Yong Jun Dong, Hong Kong (CN); Fu Yu, Hong Kong (CN)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 542 days.

(21) Appl. No.: 12/061,281

(22) Filed: Apr. 2, 2008

(65) Prior Publication Data

US 2009/0195243 A1    Aug. 6, 2009

(30) Foreign Application Priority Data

Apr. 6, 2007  (CN) .......................... 2007 1 0096875
Apr. 9, 2007  (JP) ................................ 2007-101598

(51) Int. Cl.
*G01B 7/14*    (2006.01)
(52) U.S. Cl. .................................. 324/207.13; 324/260
(58) Field of Classification Search ............. 324/207.13, 324/207.25, 244, 260; 73/430, 514.31, 514.39
See application file for complete search history.

(56) References Cited

U.S. PATENT DOCUMENTS

| 2007/0022813 A1 | 2/2007 | Kasajima |
| 2008/0068742 A1 | 3/2008 | Kasajima |

FOREIGN PATENT DOCUMENTS

| CN | 1928569 | 3/2007 |
| JP | 2732287 | 12/1997 |
| JP | 2006-90796 | 4/2006 |

OTHER PUBLICATIONS

English language Abstract of JP 2006-90796.
Chinese Office action, dated Oct. 18, 2010 along with an English translation thereof.

*Primary Examiner* — Bot L LeDynh
(74) *Attorney, Agent, or Firm* — Greenblum & Bernstein, P.L.C.

(57)    ABSTRACT

To provide a tilt angle sensor that is capable of detecting acceleration, a tilt angle, and the like of a device to which the tilt sensor angle is mounted, and also capable of reducing the size and the cost with a simple structure. The tilt angle sensor comprises: a spring member having a fixed end a free end that has a flexibility to be bent at least in one direction; a magnetic field generating device for generating a magnetic field, which is mounted at the free end of the spring member; a magnetic field detecting device provided by facing the magnetic field generating device for detecting a direction of the magnetic field generated by the magnetic field generating device; and a damping device for giving a damping force to a bending action of the spring member.

15 Claims, 21 Drawing Sheets

TILT ANGLE SENSOR AND DETECTION-TARGET DEVICE COMPRISING THE SAME

BACKGROUND OF THE INVENTION

1. Field of the Invention

The present invention relates to a tilt angle sensor and, more specifically, to a tilt angle sensor that is capable of measuring a tilt angle, acceleration, and the like at least in one direction.

2. Description of the Related Art

In order to detect an action and a tilt of a prescribed object, it has conventionally been investigated to utilize an acceleration sensor that detects the acceleration of the object. For example, the acceleration sensor can be utilized to: detect a tilt to find out whether or not a camera is being held properly at the time of pressing a shutter release; detect a tilt of a motorbike for preventing it from falling down; detect a tilt of an electronic equipment, which indicates the loaded state, e.g., whether or not it is placed horizontally; and so on. Further, the acceleration sensor can also be utilized to detect forcible shifting or falling of an electronic equipment instantly so as to take a security measure on a movable part.

Regarding the structure of an acceleration sensor according to a conventional case, as disclosed in Patent Document 1, for example, there is employed a method for detecting a strain generated in a structural unit due to acceleration. Specifically, a weight is provided at the center (intersection point) of a cross-shaped supporting member that has a spring characteristic, and a distortion detecting element is fixedly provided at each beam part of the supporting member. Deformation of each beam is detected based on detection values from the distortion detecting elements so as to detect the acceleration in directions of each of axes (X, Y, and Z). For example, there are following methods to detect acceleration. That is, acceleration may be detected by forming a bridge circuit to detect a resistance value of a semiconductor piezoelectric element that is utilized as the distortion detecting element, or by detecting a transmitting cycle according to distortion by utilizing a piezoelectric vibrator as depicted in Patent Document 1.

Further, as a tilt sensor for detecting a tilt of a device, there is also such a type that is disclosed in Patent Document 2. This tilt sensor comprises a magnet and a pendulum, and it is structured to detect changes in magnetic field directions caused due to changes in the position of the pendulum by using a Hall element. More specifically, the pendulum to which a ferromagnet is mounted is pivotally supported to a case, and a tilt is detected by detecting changes in the magnetic field of the ferromagnet mounted to the pendulum that is rotated in accordance with a rotary action of the case by using a Hall IC.

Patent Document 1: Japanese Registered Patent Publication No. 2732287
Patent Document 2: Japanese Unexamined Patent Publication 2006-90796

However, the sensors disclosed in Patent Documents mentioned above have following inconveniences. First, for the sensor disclosed in Patent Document 1, it is necessary to provide electrodes at the cross-shaped supporting member (spring) and the vicinity thereof to be used for capturing signals for detecting distortion. Thus, it is possible that the structure thereof becomes complicated because of the wirings. Further, since the distortion detecting elements are mounted to the supporting member, the size cannot be reduced. Furthermore, the distortion detecting elements are mounted or built-in to the spring part of the supporting member, which disturbs displacement of the spring and makes it difficult to detect distortion with high sensitivity.

Further, the sensor disclosed in Patent Document 2 uses the pendulum, so that it is difficult to reduce the size. Furthermore, when there is oscillation generated in the pendulum, it is difficult to resolve continuation of the oscillation in a short time. Especially, oscillation is generated also by a noise that induces oscillation of the pendulum, and such oscillation continues for a long time. If so, a tilt angle and acceleration cannot be detected while the oscillation is continuing, so that the quality as a sensor cannot be improved.

SUMMARY OF THE INVENTION

It is therefore an object of the present invention to improve the inconveniences of the conventional cases and, in particular, to provide a tilt angle sensor that is capable of detecting, with high sensitivity and high accuracy, acceleration, a tilt angle, and the like of a device to which the sensor is mounted and also capable of reducing the size and cost with a simple structure.

Therefore, the tilt angle sensor according to one aspect of the present invention comprises: a spring member having a fixed end a free end that has a flexibility to be bent at least in one direction; a magnetic field generating device for generating a magnetic field, which is mounted at the free end of the spring member; a magnetic field detecting device provided by facing the magnetic field generating device for detecting a direction of a magnetic field generated by the magnetic field generating device; and a damping device for giving a damping force to a bending action of the spring member.

In this case, it is desirable to provide the damping device near the free end of the spring member. Further, it is more desirable to provide the damping device at a far end part of the free end of the spring member or to provide the damping device to the magnetic field generating device.

With the present invention, first, when there is acceleration or a tilt generated along the direction of the flexibility of the spring member, the spring member is bent and the magnetic field generating device mounted to the free end of the spring member is shifted in the bending direction. Upon this, the direction of the magnetic field generated by the magnetic field generating device is changed as well. Through detecting the change in the direction of the magnetic field by the magnetic field detecting device, it is possible to detect a change such as a tilt or acceleration at least in one axial direction. In the meantime, since the spring member is formed to be easily oscillated and highly sensitive, it is likely to catch a noise such as an external impact that oscillates the spring member, particularly, a noise that is close to the resonance frequency. However, the oscillation can be promptly resolved by the damping device in a short time. Therefore, continuation of the oscillation of the spring member can be suppressed, thereby making it possible to detect the tilt and the like that are to be detected with high accuracy and high sensitivity. With the above, it becomes possible to constitute the small-sized and low-cost sensor with a simple structure. At the same time, it is possible to suppress influences of the noise while improving the sensitivity of the sensor for detecting the tilt angle and the acceleration. Particularly, by providing the damping device at the tip of the free end of the spring member, it is possible to improve the sensitivity and accuracy of detection still further by damping the oscillation in a shorter time through effectively applying the damping force while allowing the move of the spring member caused due to generation of a tilt or acceleration.

Further, it is desirable for the spring member to be formed with a plate-type member whose plate thickness in the bending direction of the free end is formed thin. Furthermore, it is desirable for the length thereof in the longitudinal direction that is perpendicular to the bending direction to be formed long to provide a low resonance frequency. With this, the resonance frequency becomes low, and the spring member becomes easily bent in the bending direction. That is, the tilt and the external force can be detected with high sensitivity and, as described above, the oscillation generated in the spring member due to a noise can be resolved by the damping device in a short time. Therefore, it becomes possible to detect the tilt and the acceleration with high sensitivity while suppressing influences of the noise. Further, by constituting the sensor to have high sensitivity in the manner as described above, it is also possible to suppress influences of a temperature drift caused by the magnetic field detecting device. That is, because it is possible to obtain a large detection amount by the magnetic field detecting device due to the improved sensitivity, highly accurate detection can be achieved even if there is the temperature drift generated by the magnetic field detecting device. Therefore, the quality of the sensor can be improved.

Further, the damping device is constituted with the spring member or the magnetic field generating device, and another fixing member as well as a viscous member for damping relative moves of those. In this case, it is desirable for the viscous member to be a gel-type member, for example. Further, more specifically, the damping device is constituted with: a gel-type member housing part where the gel-type member is housed, which is provided at another fixing member; and a dipping part that is a part of the spring member or the magnetic field generating member dipped into the gel-type member.

By providing the viscous member between the movable part of the spring member or the like and another fixed member in this manner, it is possible to achieve the damping device with a simple structure. Particularly, by using the gel-type member to have the movable part of the spring member or the like dipped therein, it becomes possible to give a damping force to the oscillation of the spring member efficiently so as to resolve the oscillation in a short time. Therefore, a highly sensitive sensor can be achieved at a low cost.

Further, it is desirable for the gel-type member to be a member which is not cured at temperatures from –40 degrees to 120 degrees and has a viscosity of a predetermined range. The gel-type member is a silicone gel, for example. Thereby, the damping device exhibits a prescribed viscosity within a range of temperatures of typical equipments in use. Thus, the sensor can be mounted to various kinds of devices. Further, the damping device can be constituted with widely-used members, so that it is possible to be achieved at a low cost.

Further, the above-described tilt angle sensor can be mounted to various kinds of detection-target devices that are to be the targets of detecting the acceleration and the tilt. The device is preferable to have a measuring device that measures a tilt angle or acceleration of the device itself in the bending direction of the spring member based on an output value from the tilt angle sensor mounted thereto.

The present invention is constituted in the manner described above and functions accordingly. Therefore, the present invention exhibits such excellent effects that it is possible to constitute a small-sized and low-cost sensor with a simple structure, and that it is possible to improve the sensitivity and accuracy for detecting the tilt angle and the acceleration by the sensor.

DETAILED DESCRIPTION OF THE PREFERRED EMBODIMENTS

A posture sensor according to the present invention is characterized to have a damping device for giving a damping force to a bending action of a movable spring member so as to suppress an excessive response in order to improve the detection accuracy and detection sensitivity.

While the following embodiments will be described by referring to a case of detecting a tilt angle in one direction, it is also possible to detect the tilt angles in a plurality of directions by providing a plurality of suspensions to be described later. Further, the sensor can be utilized not only for detecting the tilt angle but also for detecting acceleration based on output values. For example, the tilt angle may be measured by using static output values from the sensor, and the acceleration may be measured by using dynamic output values.

First Embodiment

Figure 3:
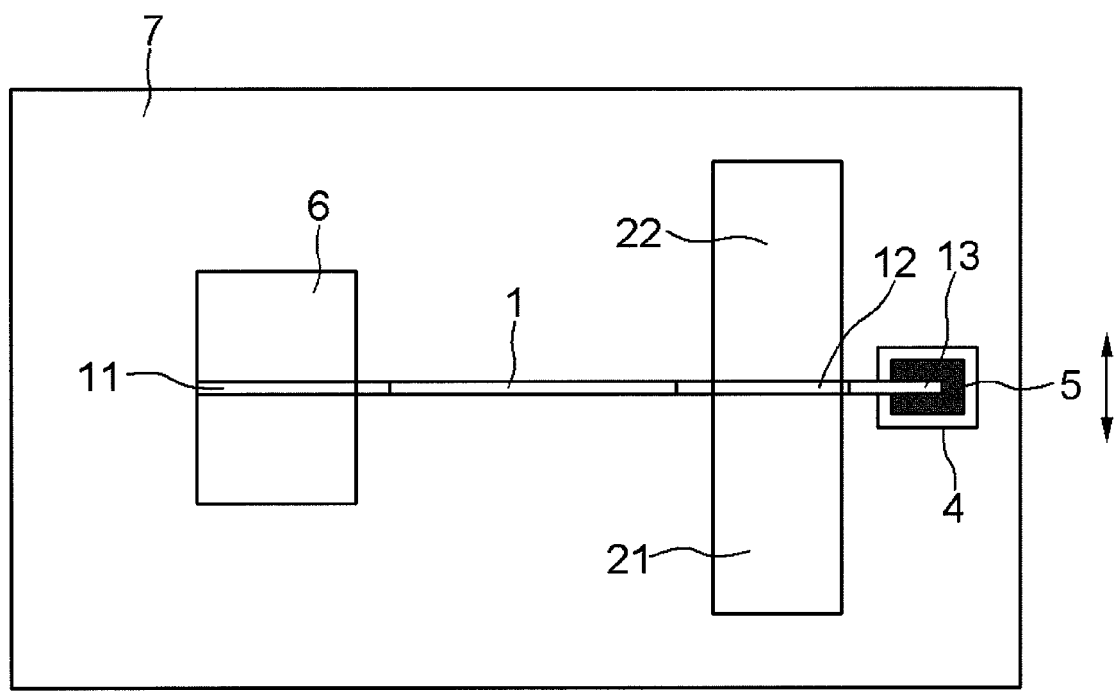
FIG. 3 is an illustration showing the structure of the tilt angle sensor according to the first embodiment, which is viewed from the above.
Figure 4:
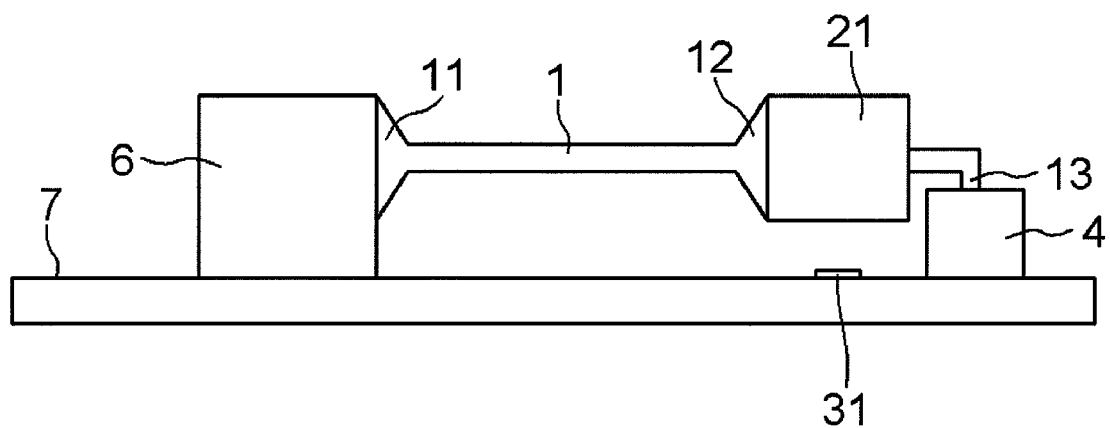
FIG. 4 is an illustration showing the structure of the tilt angle sensor according to the first embodiment, which is viewed from the side.
Figure 5:
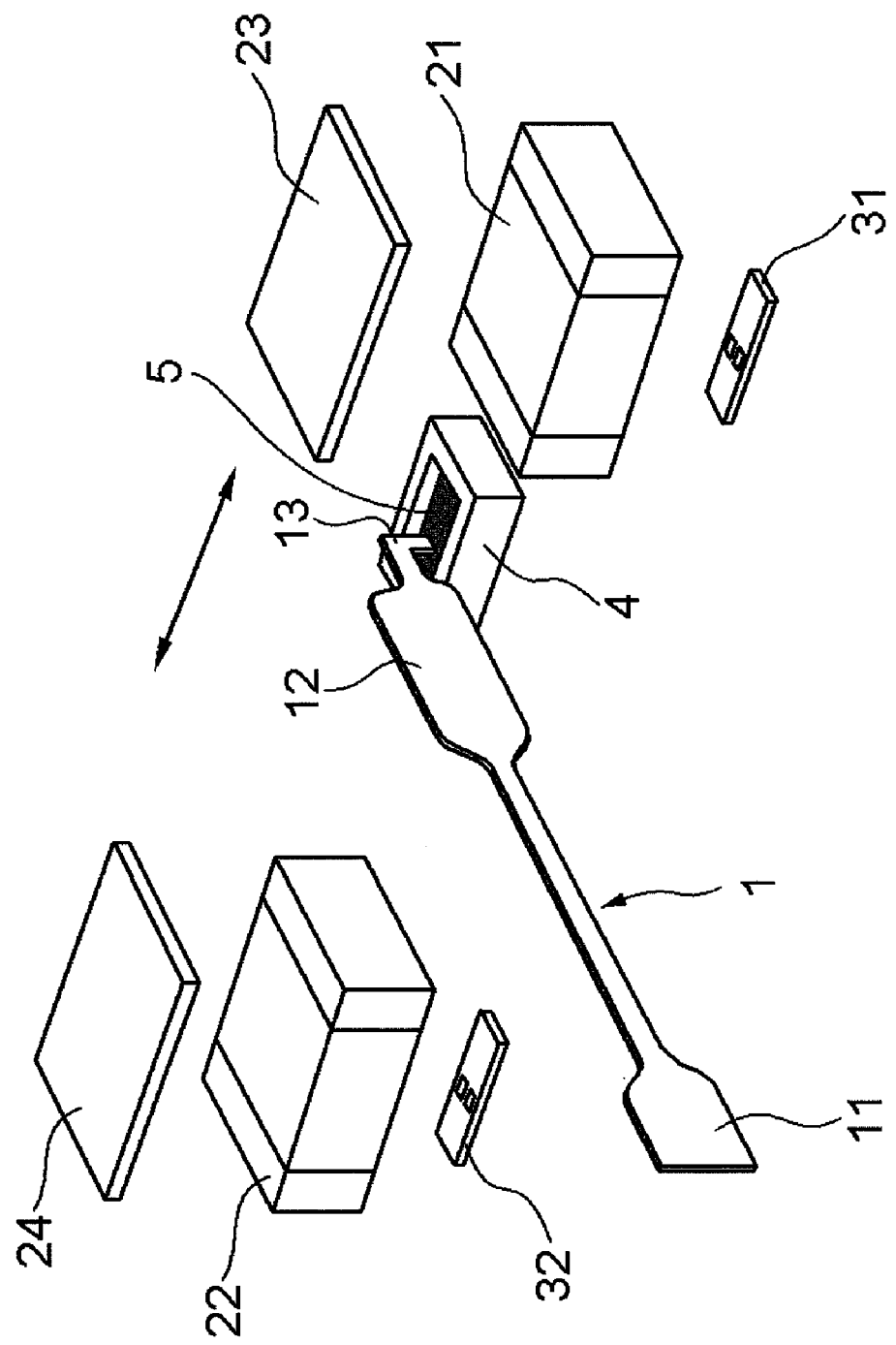
FIG. 5 is a detailed illustration showing a disassembled state of the tilt angle sensor according to the first embodiment.

A first embodiment of the present invention will be described by referring to FIG. 1-FIG. 8. FIG. 1-FIG. 4 are block diagrams of a tilt angle sensor of the first embodiment viewed from various directions. FIG. 5 is a detailed illustration of the tilt angle sensor in a disassembled state. FIG. 6-FIG. 8 are illustrations for describing a theory about detecting tilt angles.
(Structure)

Figure 1:
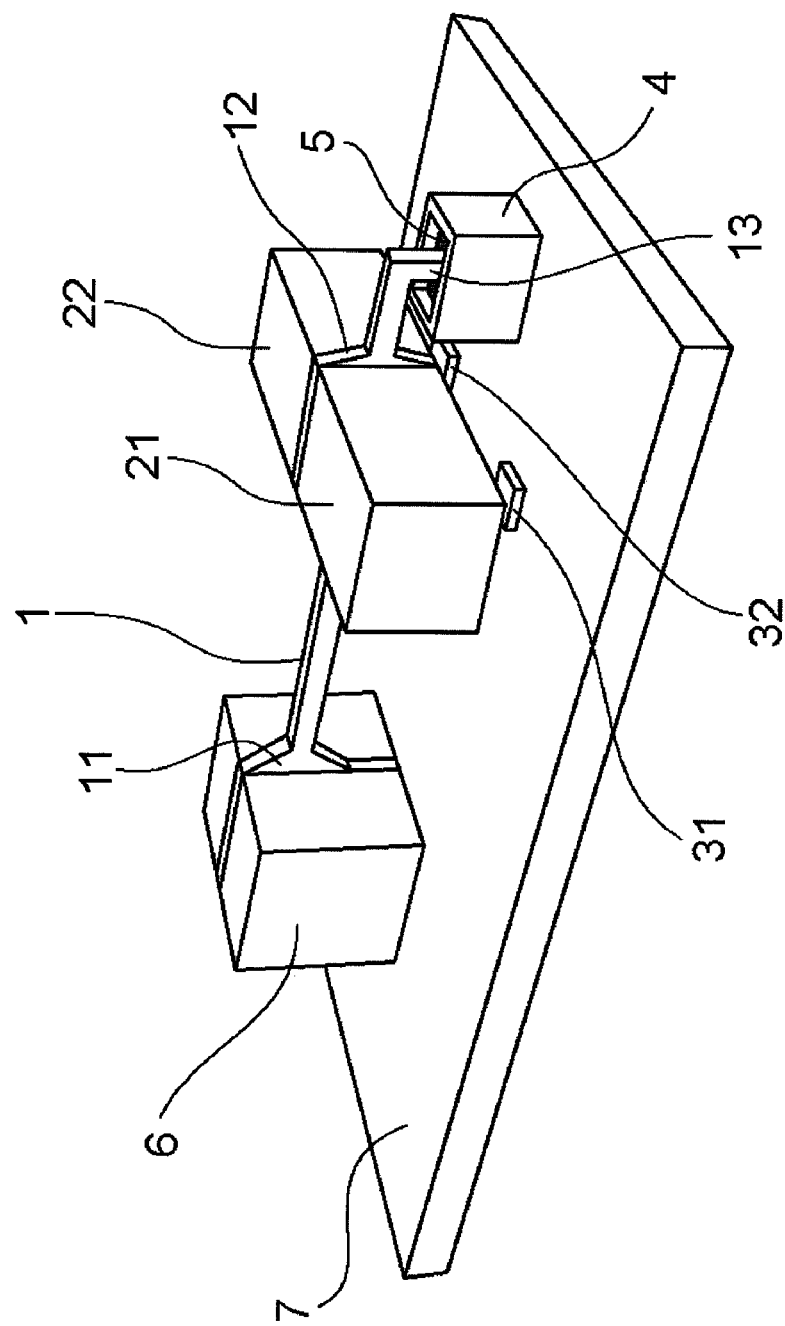
FIG. 1 is an illustration showing a structure of a tilt angle sensor according to a first embodiment, which is viewed obliquely from the top end side.
Figure 2:
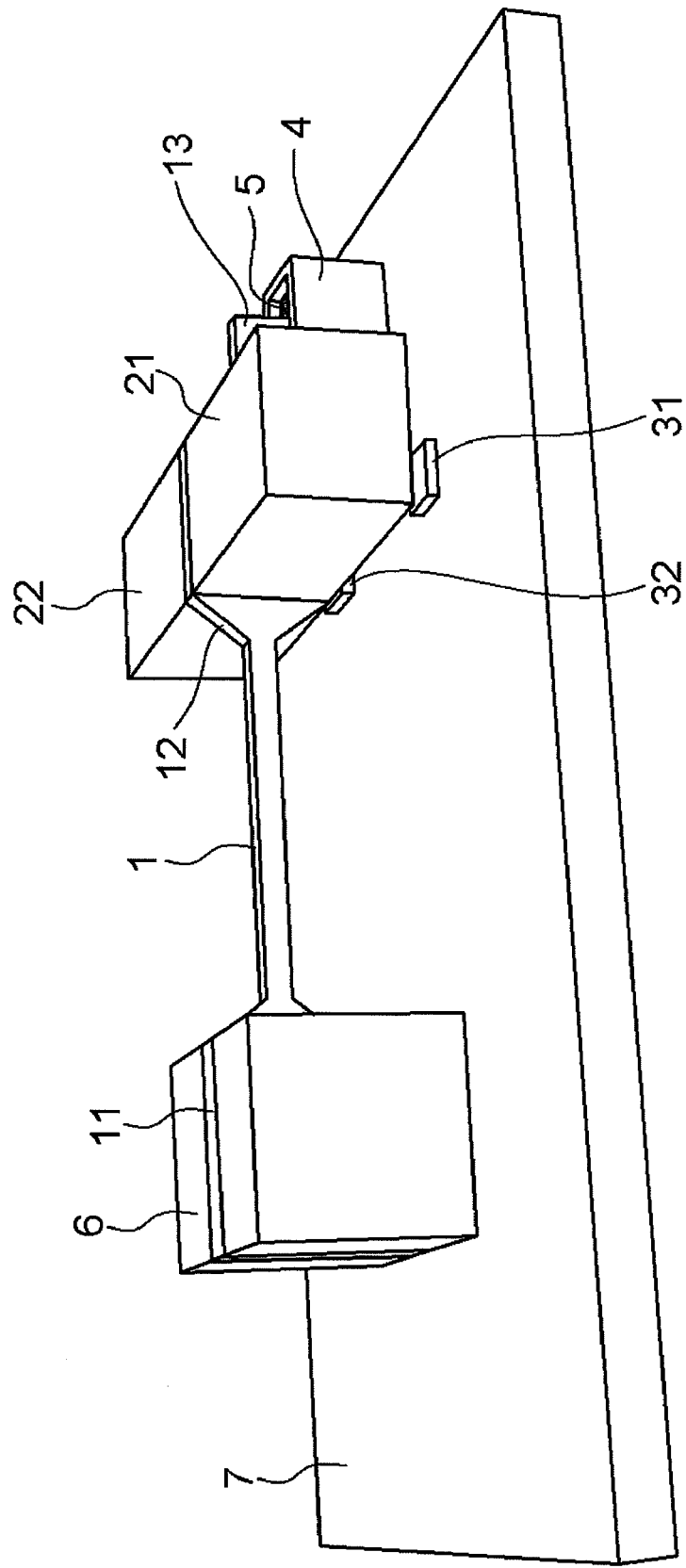
FIG. 2 is an illustration showing the structure of the tilt angle sensor according to the first embodiment, which is viewed obliquely from the rear end side.

First, FIG. 1 is an illustration of the tilt angle sensor of the first embodiment viewed obliquely from the top end side, and FIG. 2 is an illustration thereof viewed obliquely from the rear end side. FIG. 3 is an illustration of the tilt angle sensor viewed from the above, and FIG. 4 is an illustration thereof viewed from the side. Further, FIG. 5 is a detailed illustration showing each disassembled part of the tilt angle sensor.

As shown in those illustrations, the tilt angle sensor comprises a mount base 7 for loading each structural elements, a supporting block 6 fixed on the mount base 7, and a suspension 1 whose rear end part 11 fixedly supported to the supporting block 6. Magnets 21, 22 are mounted to a top end part 12 of the suspension 1, and GMR chips 31, 32 are placed on the mount base 7 positioned underneath the magnets 21, 22. Further, a dash pod 4 to which a gel 5 is filled is loaded on the mount base 7. As will be described later, a terminal for outputting output values from the above-described GMR sensors 31, 32 to a control substrate of a device to which the sensor is loaded and also an IC for performing measurement processing such as detection processing are loaded to the mount base 7. However, illustrations of those structures are omitted. Furthermore, while a casing for covering the tilt angle sensor itself from the above is provided, an illustration thereof is also omitted. Each structure will be described in more details hereinafter.

As shown in FIG. 1-FIG. 4 and in FIG. 5 in particular, the suspension 1 (spring member) is formed with a thin-plate member of a prescribed length, and it has a relatively soft spring characteristic. The suspension 1 is arranged in such a manner that the plate face thereof becomes perpendicular to the face of the mount base 7. More specifically, both ends 11 and 12 of the suspension 1 are formed to have wider plate face. In the opposite sense, the width of the plate face in the center part of the suspension 1 is formed narrower.

The rear end part 11 (fixed end) of the suspension 1 is fixed by being sandwiched between a pair of blocks provided on the mount base 7, which constitute the supporting block 6 (see FIG. 1). With this, the center part of the suspension 1 that is formed to have a narrower plate face and thinner plate thickness than the plate faces of both ends is easily bent towards the plate thickness direction as illustrated with arrows of FIG. 5, i.e. towards directions perpendicular to the longitudinal direction of the suspension 1 and in parallel to the face of the mount base 7. Therefore, the tip part 12 of the suspension 12 is formed as a free end that is capable of moving in the directions of the arrows in FIG. 5.

Further, the suspension 1 described above is formed to have a relatively long length, and it is formed to have a lower resonance frequency compared to a suspension that is formed by a same material and formed in a same plate thickness, for example. That is, if the suspension 1 is formed to have a short length, the resonance frequency becomes high and the stability is improved. However, the sensitivity becomes deteriorated. In order to improve the sensitivity, the suspension 1 in this embodiment is formed to have a long length and constituted to be easily bent by a small tilt or an external force so as to improve the detection sensitivity. In the meantime, it becomes likely to catch a noise such as an external force that oscillates the suspension 1 in a bending direction, particularly, a noise of a frequency close to the resonance frequency. This tends to generate oscillation of the suspension 1. However, this embodiment provides a damping device to the tip side of the suspension 1 as will be described later, so that the oscillation caused by such noise can be promptly resolved in a short time. This makes it possible to detect the tilt, the acceleration, and the like with high accuracy and high sensitivity while eliminating influences of the noise as much as possible.

The longer the length of the suspension 1, the more the detection sensitivity can be improved. However, it is also desirable to reduce the size of the tilt angle sensor. Therefore, it is preferable to design the suspension 1 in such a manner that a desirable sensitivity of the sensor can be obtained while reducing the size of the sensor itself as much as possible.

Further, as described above, the magnets 21 and 22 are provided, respectively, on both faces of the tip part 12 of the suspension 1 that is formed to have the wider plate face. Shielding plates 23 and 24 (see FIG. 5) are provided on the top faces of each of the magnets 21 and 22. Further, GMR chips 31, 32 for detecting the magnetic fields from the magnets 21, 22 are placed, respectively, underneath each of the magnets 21, 22 on the mount base 7. Now, the magnets 21, 22 and the GMR chips 31 32 will be described in details by referring to FIG. 6-FIG. 8.

Figure 7A:
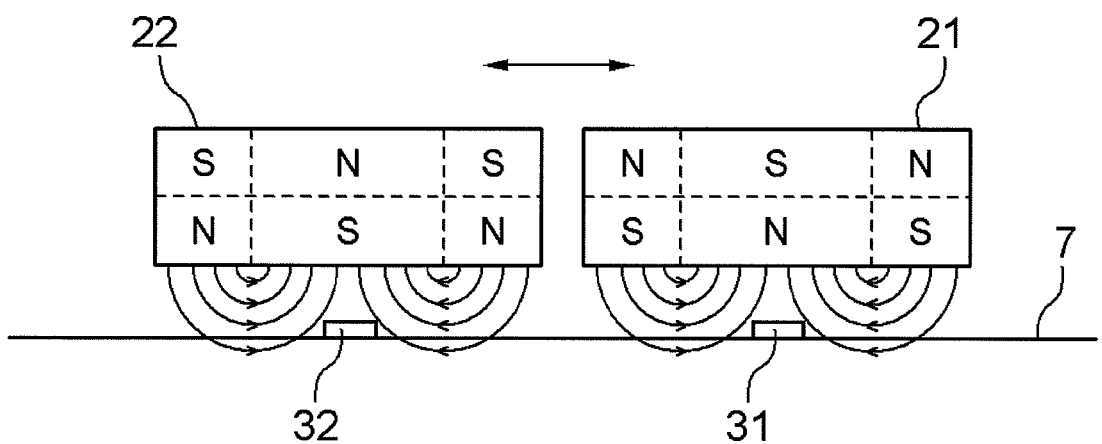
FIG. 7A is an illustration for describing a relation between structures of magnets and GMR chips.
Figure 8:
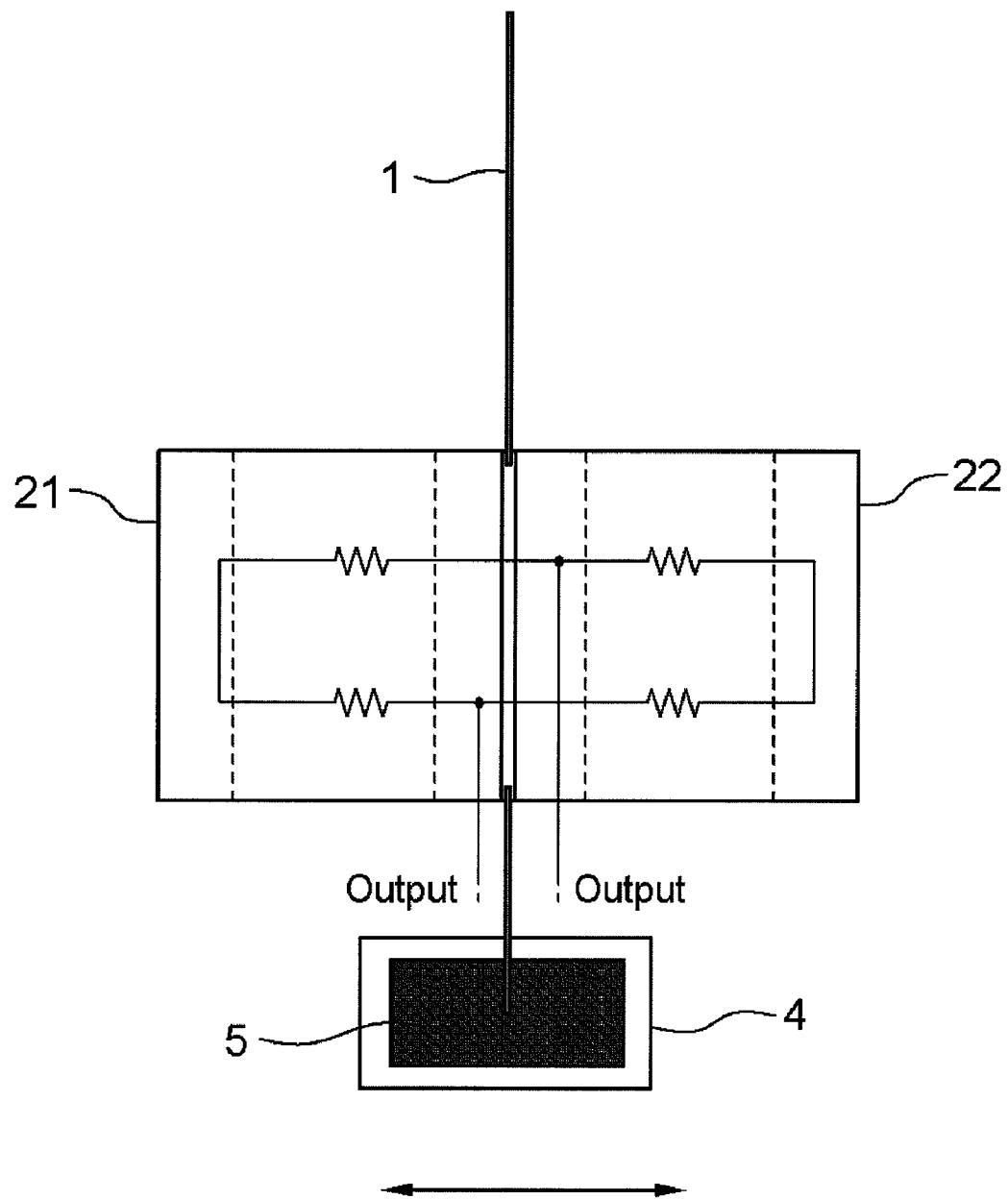
FIG. 8 is an illustration for describing the theory about detecting the magnetic field directions by using the GMR element.

As shown in FIG. 7A, the magnets 21 and 22 (magnetic field generating devices) are constituted with sets of magnets and are formed in such a manner that the N-pole and the S-pole are arranged alternately on the face of the mount base 7 side (bottom faces of the magnets). For example, the magnet 21 has the S-pole on both ends of the bottom face and the N-pole in the center, while the magnet 22 has the N-pole on both ends of the bottom face and the S-pole in the center. Thus, magnetic fields are generated in the directions indicated by circular arc arrows shown in FIG. 7A.

Each of the GMR chips 31 and 32 is arranged underneath the respective magnets 21 and 22 almost at the center thereof. Each of the GMR chips 31 and 32 (magnetic field detecting devices) is equipped with a single GMR element or a plurality of GMR elements (not shown). In this embodiment, it is assumed that each of the GMR chips 31 and 32 is provided with two GMR elements. The GMR element is a magnetoresisance element which outputs an MR resistance value in accordance with the direction of an inputted magnetic field. The theory of detecting a tilt angle using the GMR element will be described further by referring to FIG. 6.

Figure 6A:
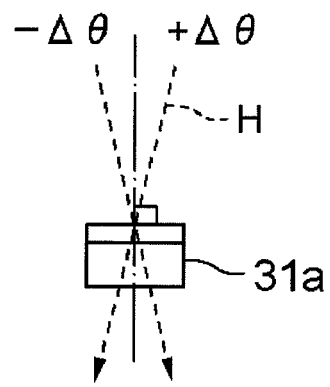
FIG. 6A is an illustration for describing a theory about detecting magnetic field directions by using a GMR element.
Figure 6B:
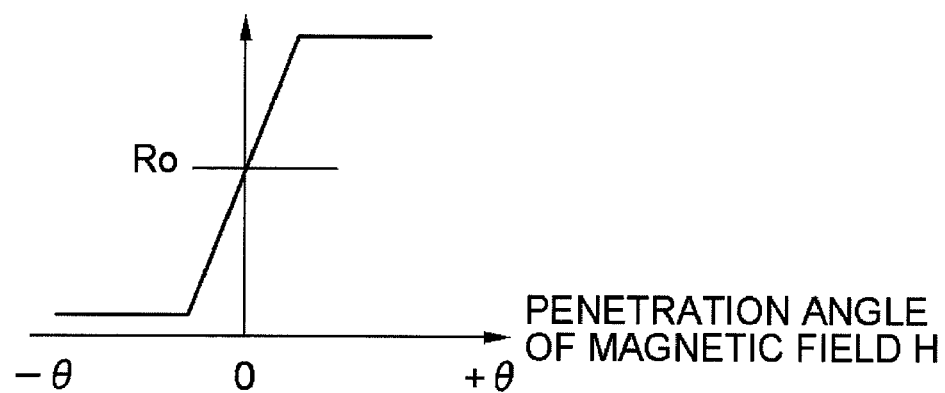
FIG. 6B is an illustration for describing the theory about detecting the magnetic field directions by using the GMR element.
Figure 7B:
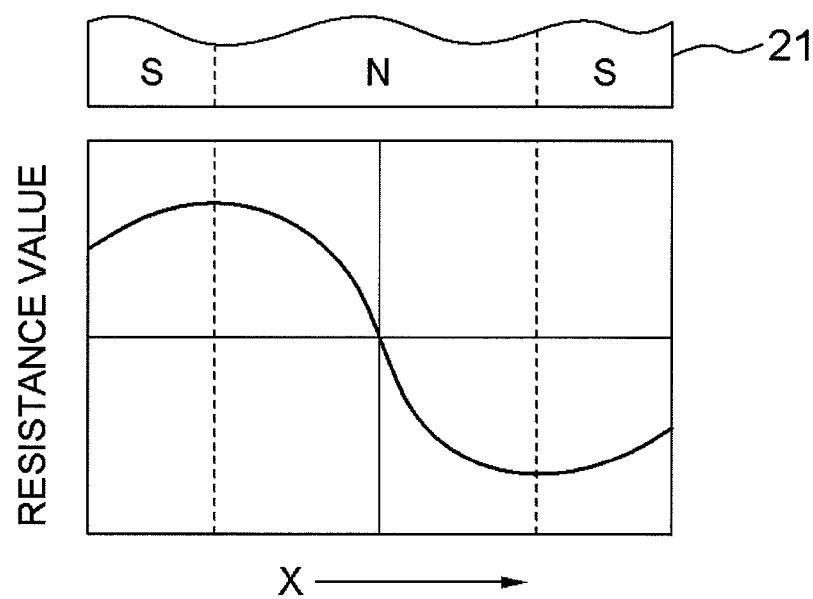
FIG. 7B is an illustration for describing the relation between the magnet structure and the GMR chip.

First, one of GMR elements 31a is illustrated in FIG. 6A, and it is assumed that the magnet 21 is placed thereabove. The GMR element 31a is arranged to be almost perpendicular to the direction of a magnetic field H from the magnet 21, when there is no acceleration applied in any directions (see an alternate long and short dash line in FIG. 6A). Note here that the direction of the magnetic field H may be opposite from the direction illustrated in the drawing. When the magnet 21 moves under such condition, the direction of the magnetic field H from the magnet 21 changes as in dotted lines of FIG. 6A, and the direction of the penetrating magnetic field H for the GMR element 31a is tilted by ±Δθ from the perpendicular direction. The GMR element 31a has such a characteristic that the MR resistance value changes as in FIG. 6B under that condition. In the case of FIG. 6B, assuming that the resistance value under a perpendicular condition is set as Ro, the MR resistance value changes dramatically when there is a tilt of only a very small angle. Because of such characteristic, the GMR chip 31 provided underneath the magnet 21 has such a property that the resistance value changes in accordance with the move of the magnet 21, as shown in FIG. 7B, for example.

Then, a bridge circuit is formed with each of the GMR elements (four) of the respective GMR chips 31 and 32 described above as in FIG. 8 so as to output a differential voltage. This makes it possible to detect changes in the resistance values of the GMR elements easily with high accuracy based on the differential voltage. Then, a tilt angle can be measured based on the magnitude of the detected resistance value. At that time, the tilt angle can be measured by utilizing the static value of the resistance value, and acceleration can be measured by utilizing the change in the resistance value within a specific time.

Next, the damping device provided to the tip part of the suspension 1 will be described. First, a bent part 13 that is bent downwards, i.e. towards the mount base 7, at almost an acute angle is formed at the far end part of the suspension 1. The dash pod 4 constituting a rectangular housing recessed part is provided on the mount base 7 underneath the bent part 13. The gel 5 (gel-type member (viscous member)) is filled inside the housing recessed part. Filled inside the dash pod 4 is about an amount of the gel 5 with which the liquid face thereof comes at a position lower than the position of the opening face, and the lower end part of the above-described bent part 13 can be dipped within the gel 5. That is, the lower end part of the bent part 13 is a dipping part that is dipped within the gel 5.

Specifically, the gel 5 described above is a silicone gel. In particular, it is a member having a prescribed range of viscosity, which is not cured by a range of temperatures of typical equipments in use, e.g., from −40 degrees to 120 degrees. Further, regarding the viscosity of the gel 5, it is preferable, by considering the rigidity and the like of the suspension 1, to use those with the viscosity in a range that can give a proper damping force for resolving the oscillation of the suspension 1 in a short time while allowing the move of the magnets 21, 22 provided at the tip part by bending of the suspension 1. The gel 5 filled within the dash pod 4 is not limited to the above-described material. It may also be a member of another material.

(Operations)

Next, a tilt angle detecting operation performed by the tilt angle sensor with the above-described constitution will be described. First, the rear end part 11 of the suspension 1 is fixedly supported by the supporting block 6, and the tip part 12 side of the suspension 1 at which the magnets 21, 22 are provided is located over the mount base 7 at a prescribed height that is being away from the mount base 7 by a prescribed space. At this time, the suspension 1 is so arranged that the plate face thereof becomes perpendicular to the face of the mount base 7. Therefore, the rigidity in the upward and downward directions is set to be high, so that downward displacement of the tip part 12 by gravity can be suppressed.

The suspension 1 is formed to have a long length and thin plate thickness, so that it is easily bent in the perpendicular directions with respect to the plate face of the suspension 1, i.e. in the arrow directions of FIG. 3. Therefore, when tilt is generated or an external force is applied along the arrow directions of FIG. 3, the suspension 1 is bent and the magnet 21 provided at the tip part 12 is shifted along the arrow directions. That is, the tilt or the external force can be detected with high sensitivity. In the meantime, the suspension 1 is easily oscillated by a noise such as an external force that is close to the resonance frequency in particular. However, as described above, the bent part 13 located at the far end part of the suspension 1 moves within the gel 5 in accordance with the oscillation, so that a damping force for the mount base 7 (another fixing member) is applied to the suspension 1 because of the viscosity of the gel 5. As a result, the oscillation of the suspension 1 (magnets 21, 23 part) can be resolved promptly in a short time, which makes it possible to maintain a state that is capable of detecting the tilt and the like at all times by suppressing an influence of the noise.

When there is a tilt or acceleration to be detected, the suspension 1 becomes bent and the magnets 21, 22 are shifted. With this, the magnetic fields for the GMR chips 31, 32 located thereunder are changed (see FIG. 7A), so that the MR resistance values detected by the GMR chips 31, 32 become changed. Based on the resistance values, it is possible to measure the tilt angles by referring to a corresponding map data or the like, which shows the relation between preset resistance values and tilt angles. In the manner as described above, it is possible to suppress the influences of the noise and to improve the detection sensitivity.

Further, since the suspension 1 is constituted to have high detection sensitivity as described above, it is also possible to suppress influences of a temperature drift caused by the magnetic field detecting device. That is, because it is possible to obtain a large detection amount by the GMR chips 31 and 32 due to the improved sensitivity, highly accurate detection can be achieved even if there is a temperature drift generated in the GMR chips 31 and 32. Therefore, the quality of the sensor can be improved.

In the above, illustrated as a way of example is the case of using the GMR elements for detecting the directions of the magnetic fields by the move of the magnets 21, 22. However, it is also possible to utilize other elements that are capable of detecting the magnetic fields, such as Hall elements.

Second Embodiment

Figure 9:
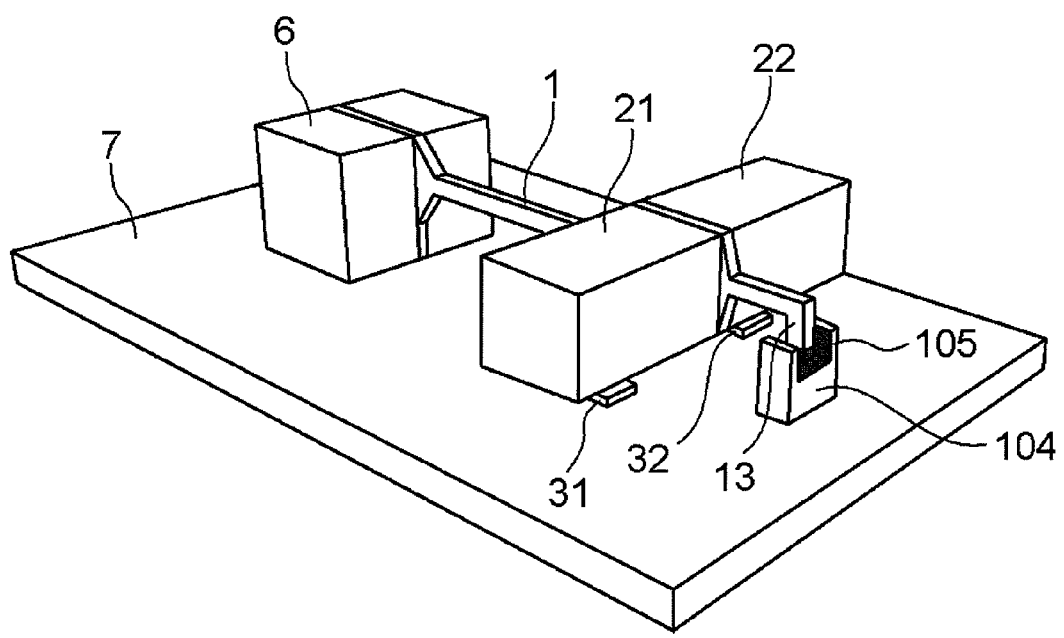
FIG. 9 is an illustration showing a structure of a tilt angle sensor according to a second embodiment, which is viewed obliquely from the top end side.
Figure 10:
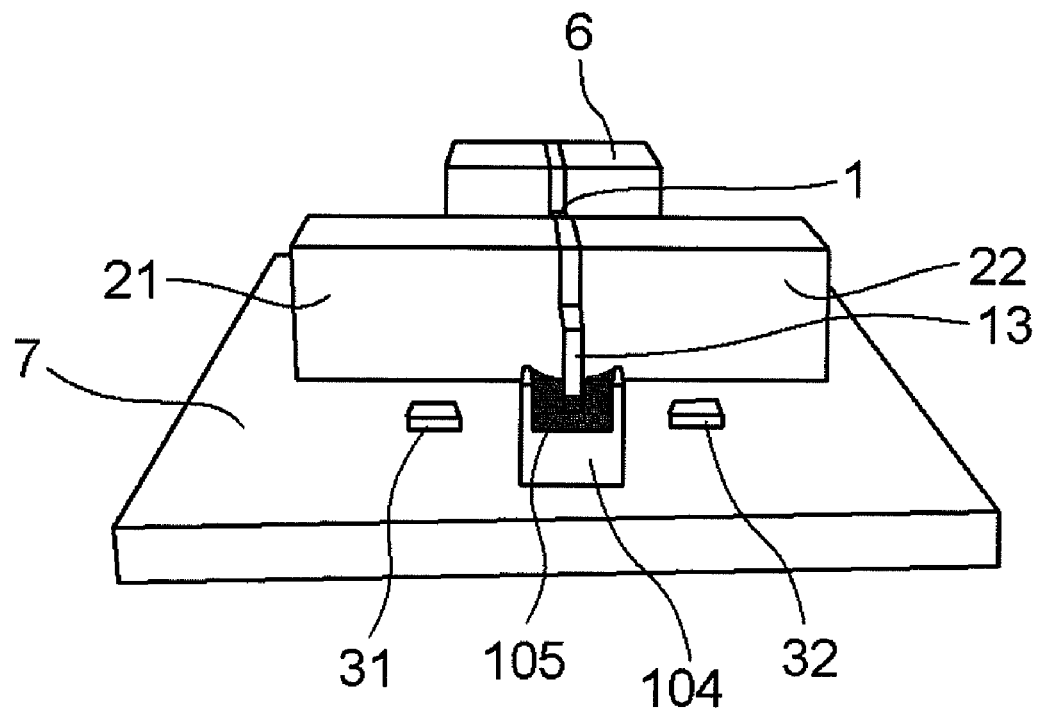
FIG. 10 is an illustration showing the structure of the tilt angle sensor according to the second embodiment, which is viewed from the front.

Next, a second embodiment of the present invention will be described by referring to FIG. 9-FIG. 10. FIG. 9 is an illustration of a tilt angle sensor according to the second embodiment viewed obliquely from the front, and FIG. 10 is an illustration thereof viewed almost from the straightforward direction.

The tilt angle sensor according to the second embodiment employs almost the same constitution as the one disclosed in the above-described first embodiment, except for the structure of a dash pod 104. As shown in FIG. 9 and FIG. 10, the dash pod 104 according to the second embodiment has two plate-like parts extended upwards in parallel, and it is formed to open upwardly in substantially U-letter form. A gel 105 having a prescribed viscosity is filled between the two plate-like parts. The gel 105 is housed by being remained within the U-letter part of the dash pod 104 because of the viscosity. The lower end part of the bent part 13 that is a part of the suspension 1 is dipped in the gel 105.

With this, as in the above-described case, the suspension 1 is formed to be easily bent. Thus, the suspension 1 is bent by responding to acceleration or a tilt with high sensitivity, and the magnets 21 and 22 are shifted. Thereby, the directions of the magnetic fields for the GMR chips 31, 32 located thereunder are changed, so that the MR resistance values detected by the GMR chips 31, 32 become changed. Thus, it is possible to measure the tilt from the detected resistance values. In the meantime, the suspension 1 is likely to catch a noise such as an external impact that oscillates the suspension 1, and it is easily oscillated by a noise that is close to the resonance frequency in particular. However, a damping force is applied to the suspension 1 by the gel 105, so that the oscillation can be promptly resolved in a short time. This makes it possible to improve the detection sensitivity and detection accuracy by suppressing influences of the noise.

Third Embodiment

Figure 11:
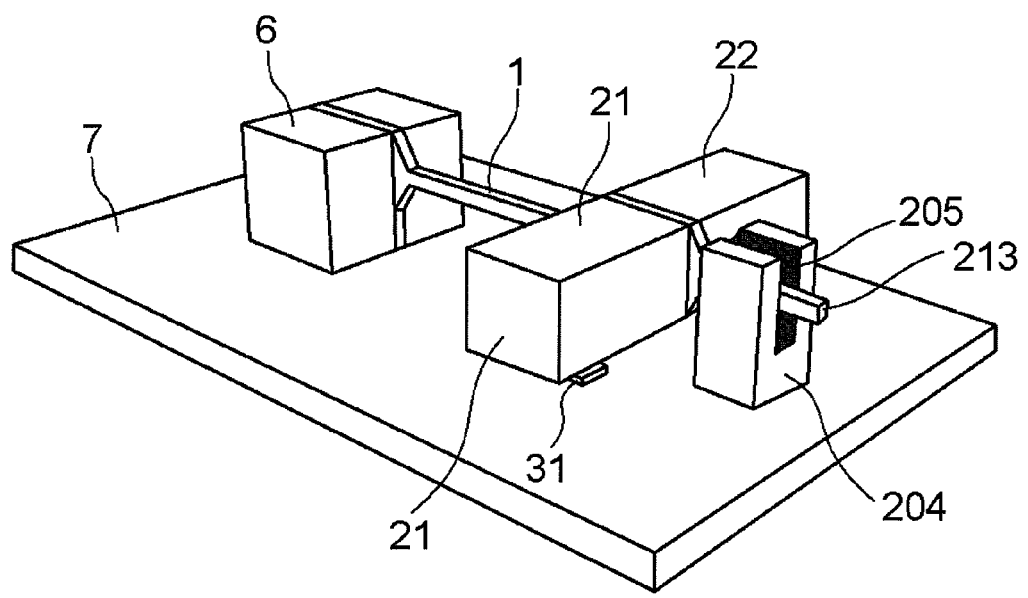
FIG. 11 is an illustration showing a structure of a tilt angle sensor according to a third embodiment, which is viewed obliquely from the top end side.
Figure 12:
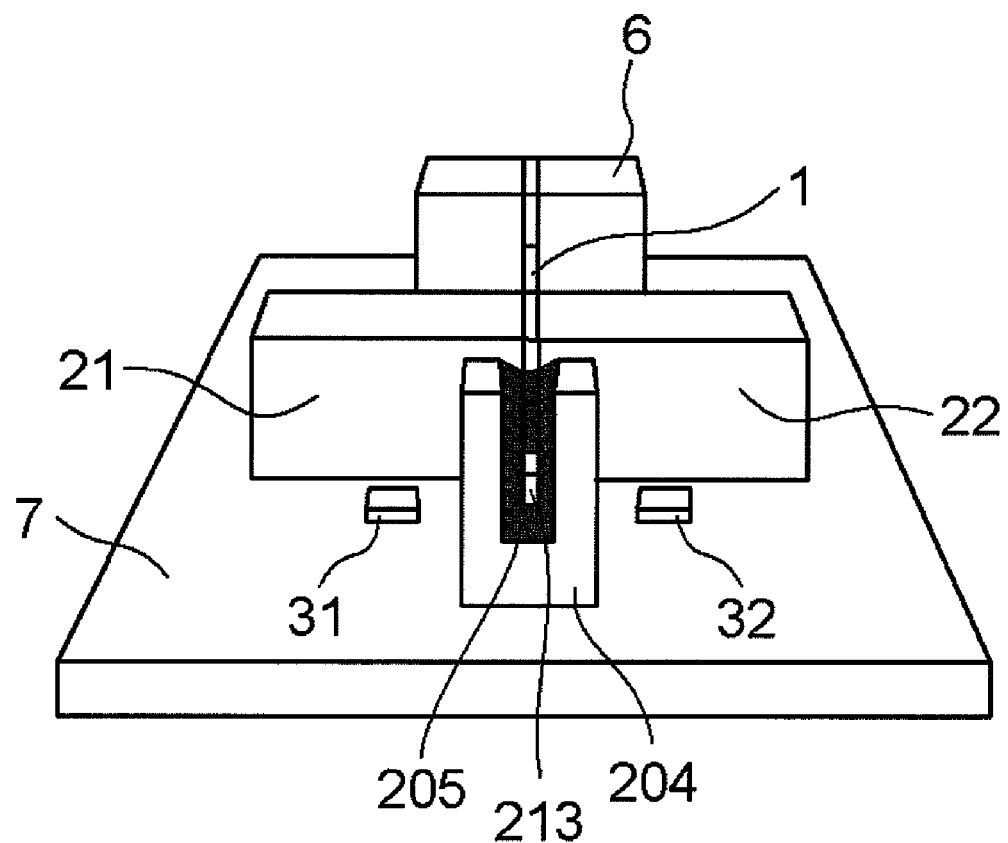
FIG. 12 is an illustration showing the structure of the tilt angle sensor according to the third embodiment, which is viewed from the front.

Next, a third embodiment of the present invention will be described by referring to FIG. 11-FIG. 12. FIG. 11 is an illustration of a tilt angle sensor according to the third embodiment viewed obliquely from the front, and FIG. 12 is an illustration thereof viewed almost from the straightforward direction.

The tilt angle sensor according to the third embodiment employs almost the same constitution as the one disclosed in the above-described second embodiment, except for the shape of the tip part of the suspension 1. A dash pod 204 according to the third embodiment has two plate-like parts extended upwards in parallel, and it is formed to open upwardly in substantially U-letter form, as in the case of the second embodiment. The height of the two plate-like parts is set higher than the case of the second embodiment, and a gel 205 having a prescribed viscosity is filled therebetween.

A far end part 213 of the suspension 1 according to this embodiment is not bent downwards. It is extended along the longitudinal direction of the suspension 1, and formed in a length so as to go through the gel 205 filled into the above-described dash pod 204. That is, a part of the far end part 203 is dipped in the gel 205.

With this, as in the above-described case, the suspension 1 is formed to be easily bent. Thus, the suspension 1 is bent by responding to acceleration and a tilt with high sensitivity, and the magnets 21 and 22 are shifted. Thereby, the directions of the magnetic fields for the GMR chips 31, 32 positioned thereunder are changed, so that the MR resistance values detected by the GMR chips 31, 32 become changed. Thus, it is possible to measure the tilt from the detected resistance values. In the meantime, the suspension 1 is likely to catch a noise such as an external impact that oscillates the suspension 1, and it is easily oscillated by a noise that is close to the resonance frequency in particular. However, a damping force is applied to the suspension 1 by the gel 205, so that the oscillation can be promptly resolved in a short time. This makes it possible to improve the detection sensitivity and detection accuracy while suppressing influences of the noise.

Fourth Embodiment

Figure 13:
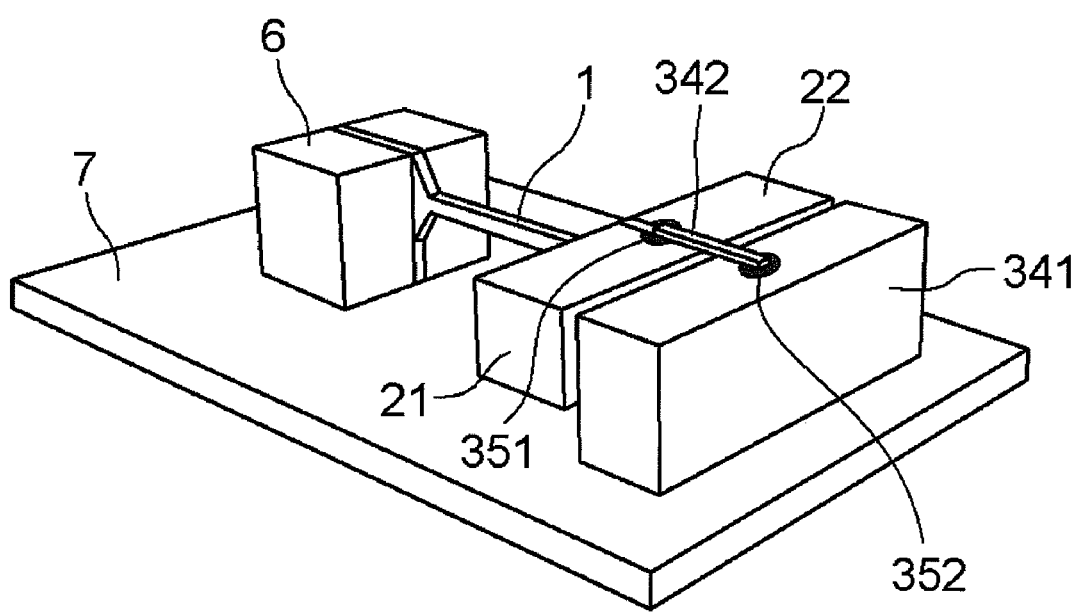
FIG. 13 is an illustration showing a structure of a tilt angle sensor according to a fourth embodiment, which is viewed obliquely from the top end side.
Figure 14:
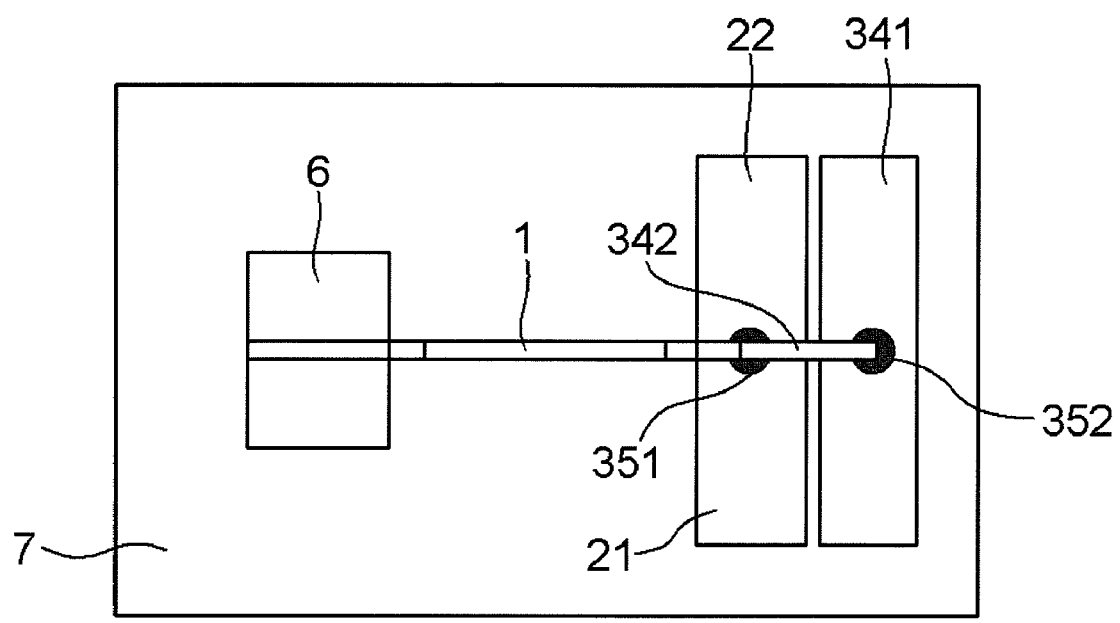
FIG. 14 is an illustration showing the structure of the tilt angle sensor according to the fourth embodiment, which is viewed from the above.

Next, a fourth embodiment of the present invention will be described by referring to FIG. 13-FIG. 14. FIG. 13 is an illustration of a tilt angle sensor according to the fourth embodiment viewed obliquely from the front, and FIG. 14 is an illustration thereof viewed from the above.

The tilt angle sensor according to the fourth embodiment employs almost the same constitution as the one disclosed in the above-described first embodiment, except that the dash pod 4 is not provided and the damping device employs another structure. Specifically, as shown in FIG. 13 and FIG. 14, substantially a cuboid fixed wall part 341 arranged almost in parallel with the magnets 21 and 22 is fixedly loaded on the mount base 7 on the far end side than the tip part of the suspension 1. The height of the fixed wall part 341 is set as almost the same as that of the magnets 21 and 22 which are supported on the mount base 7 by the suspension 1.

Further, as shown in the drawing, a bar-type connecting member 342 is provided for connecting the upper part of the tip part of the suspension 1 and the top part of the fixed wall part 341. In accordance with this, gels 351 and 352 in a prescribed amount are provided, respectively, by being attached to the upper part of the tip part of the suspension 1 and the upper part of the fixed wall part 341. Both end parts of the above-described connecting member 342 are dipped into the gels 351 and 352, respectively. That is, the connecting member 342 connects the suspension 1 (magnets 21 and 22) and the fixed wall part 341 via the gels 351 and 352.

The gels 351 and 352 may also be filled in respective housing parts, which are formed on the upper part of the tip part of the suspension 1 and the upper part of the fixed wall part 341. In accordance with this, both ends of the connecting member 342 are dipped into the gels 351 and 352 that are housed in the gel housing parts.

With this, as in the above-described case, the suspension 1 is formed to be easily bent. Thus, the suspension 1 is bent by responding to acceleration and a tilt with high sensitivity, and the magnets 21 and 22 are shifted. Thereby, the directions of the magnetic fields for the GMR chips 31, 32 positioned thereunder are changed, so that the MR resistance values detected by the GMR chips 31, 32 become changed. Thus, it is possible to measure the tilt from the detected resistance values. In the meantime, the suspension 1 is likely to catch a noise such as an external impact that oscillates the suspension 1, and it is easily oscillated by a noise that is close to the resonance frequency in particular. However, a damping force is applied to the suspension 1 via the connecting member 342 by the gels 351 and 352 for the fixed wall member 341, so that the oscillation can be promptly resolved in a short time. This makes it possible to improve the detection sensitivity and detection accuracy while suppressing influences of the noise.

Fifth Embodiment

Figure 15:
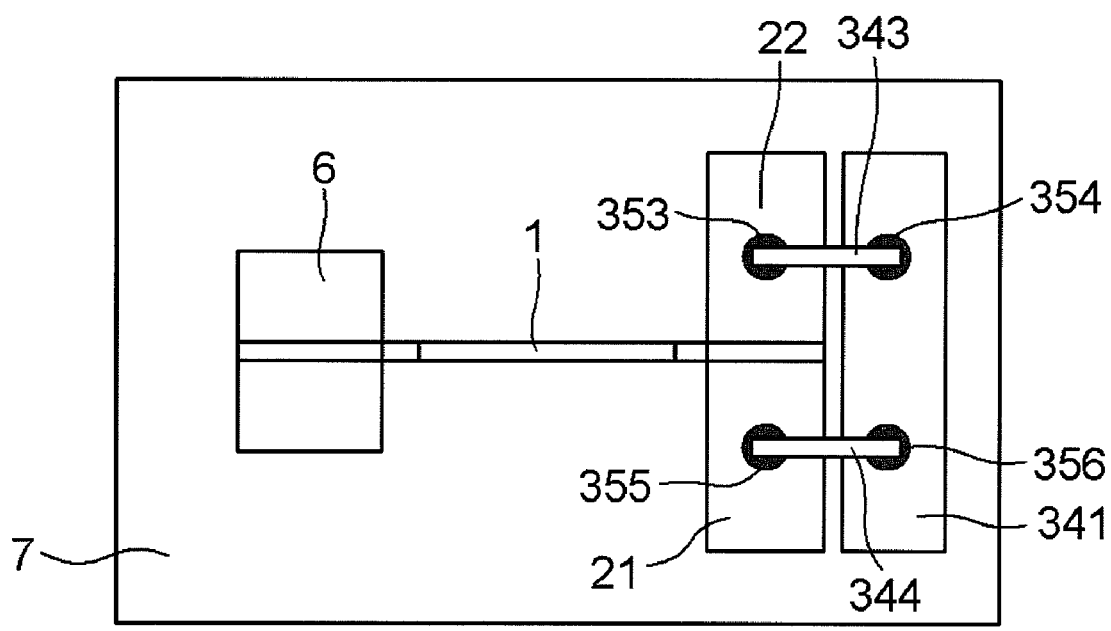
FIG. 15 is an illustration showing a structure of a tilt angle sensor according to a fifth embodiment, which is viewed from the above.

Next, a fifth embodiment of the present invention will be described by referring to FIG. 15. FIG. 15 is an illustration of a tilt angle sensor according to the fifth embodiment viewed from the above.

The tilt angle sensor according to the fifth embodiment employs almost the same constitution as the one disclosed in the above-described fourth embodiment, except that the structure of the damping device is slightly different. Specifically, as shown in FIG. 15, it is different in respect that there are two connecting members 343 and 344 provided therein. In such case, gels 353, 354, 355, and 356 in a prescribed amount are provided, respectively, by being attached to the upper parts of the magnets 21, 22 of the suspension 1 and the upper part of the fixed wall part 341. Both end parts of each of the above-described connecting members 343, 344 are dipped into the gels 353, 354, 355, and 356, respectively. That is, the connecting members 343 and 344 connect the suspension 1 (magnets 21 and 22) and the fixed wall part 341 via the gels 353-356.

The gels 353-356 may also be filled in respective housing parts which are formed on the upper part of the tip part of the suspension 1 and the upper part of the fixed wall part 341. In accordance with this, both ends of each of the connecting members 343, 344 are dipped into the gels 353-356 that are housed in the gel housing parts.

With this, as in the above-described case, the suspension 1 is formed to be easily bent. Thus, the suspension 1 is bent by responding to acceleration and a tilt with high sensitivity, and the magnets 21 and 22 are shifted. Thereby, the directions of the magnetic fields for the GMR chips 31, 32 positioned thereunder are changed, so that the MR resistance values detected by the GMR chips 31, 32 become changed. Thus, it is possible to measure the tilt from the detected resistance values. In the meantime, the suspension 1 is likely to catch a noise such as an external impact that oscillates the suspension 1, and it is easily oscillated by a noise that is close to the resonance frequency in particular. However, a damping force is applied to the suspension 1 via the connecting members 343, 344 by the gels 353, 354, 355, and 356 for the fixed wall member 341, so that the oscillation can be promptly resolved in a short time. This makes it possible to improve the detection sensitivity and detection accuracy while suppressing influences of the noise.

Sixth Embodiment

Figure 16:
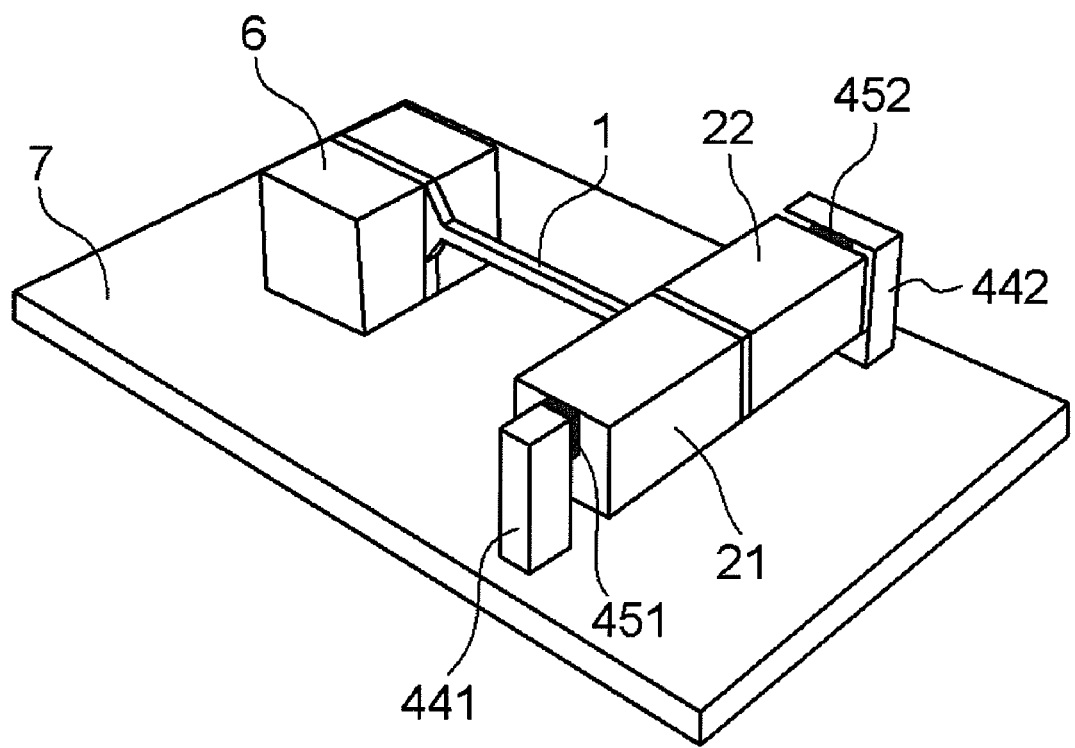
FIG. 16 is an illustration showing a structure of a tilt angle sensor according to a sixth embodiment, which is viewed obliquely from the top end side.
Figure 17:
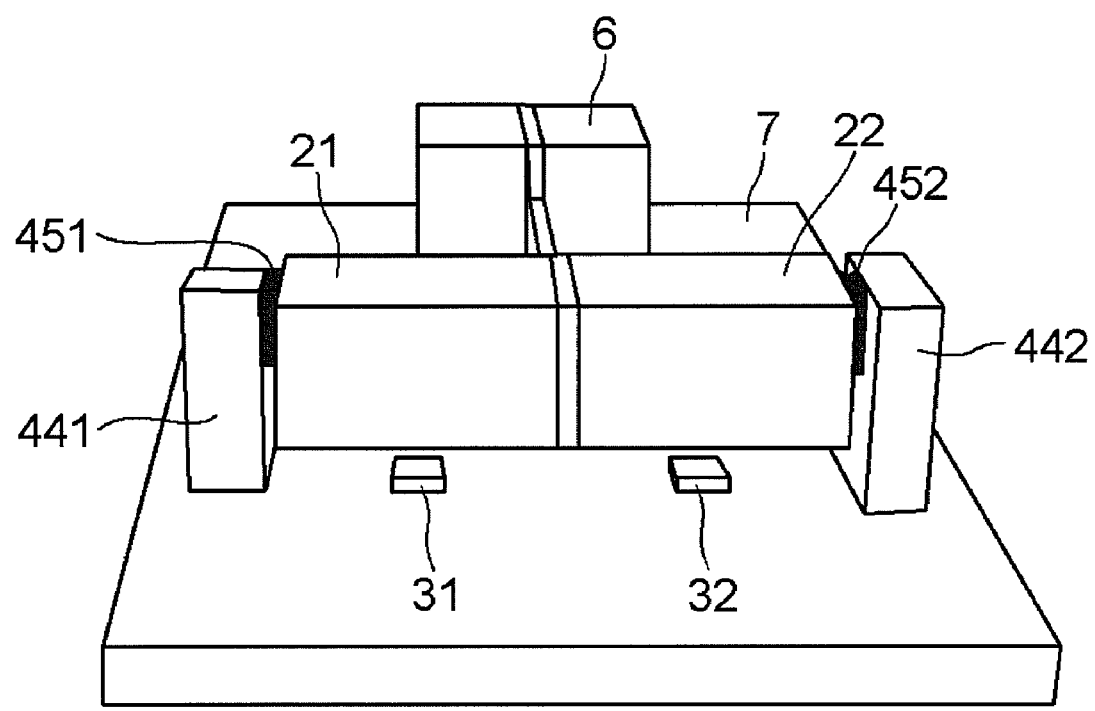
FIG. 17 is an illustration showing the structure of the tilt angle sensor according to the sixth embodiment, which is viewed from the front.

Next, a sixth embodiment of the present invention will be described by referring to FIG. 16-FIG. 17. FIG. 16 is an illustration of a tilt angle sensor according to the sixth embodiment viewed obliquely from the front, and FIG. 17 is an illustration thereof viewed from the above.

The tilt angle sensor according to the sixth embodiment employs almost the same constitution as the one disclosed in the above-described first embodiment, except that the dash pod 4 is not provided and the damping device employs another structure. Specifically, as shown in FIG. 16 and FIG. 17, substantially cuboid fixed wall parts 441, 442, each of which being arranged almost in parallel to the magnets 21 and 22, are fixedly loaded on the mount base 7 on the flank side of each of the magnets 21, 22 that are provided at the tip part of the suspension 1. The height of each of the fixed wall parts 441, 442 is set as almost the same as that of the magnets 21 and 22 supported on the mount base 7 by the suspension 1.

Further, as shown in the drawings, gels 451 and 452 in a prescribed amount are provided, respectively, by being attached between each of the side parts of the magnets 22, 23 and the respective neighboring fixed wall parts 441, 442. The gels 451 and 452 remain stuck between the magnets 22, 23 and the fixed wall parts 441, 442 because of the viscosity.

With this, as in the above-described case, the suspension 1 is formed to be easily bent. Thus, the suspension 1 is bent by responding to acceleration and a tilt with high sensitivity, and the magnets 21 and 22 are shifted. Thereby, the directions of the magnetic fields for the GMR chips 31, 32 positioned thereunder are changed, so that the MR resistance values detected by the GMR chips 31, 32 become changed. Thus, it is possible to measure the tilt from the detected resistance values. In the meantime, the suspension 1 is likely to catch a noise such as an external impact that oscillates the suspension 1, and it is easily oscillated by a noise that is close to the resonance frequency in particular. However, a damping force is applied to the suspension 1 by the gels 451, 452 for the fixed wall members 441, 442, so that the oscillation can be promptly resolved in a short time. This makes it possible to improve the detection sensitivity and detection accuracy while suppressing influences of the noise.

Seventh Embodiment

Next, examples of mounting the tilt angle sensor of the above-described constitution will be described. First, the tilt angle sensor described above can be utilized by being mounted to a camera. A specific example thereof will be described by referring to FIG. 18.

Figure 18:
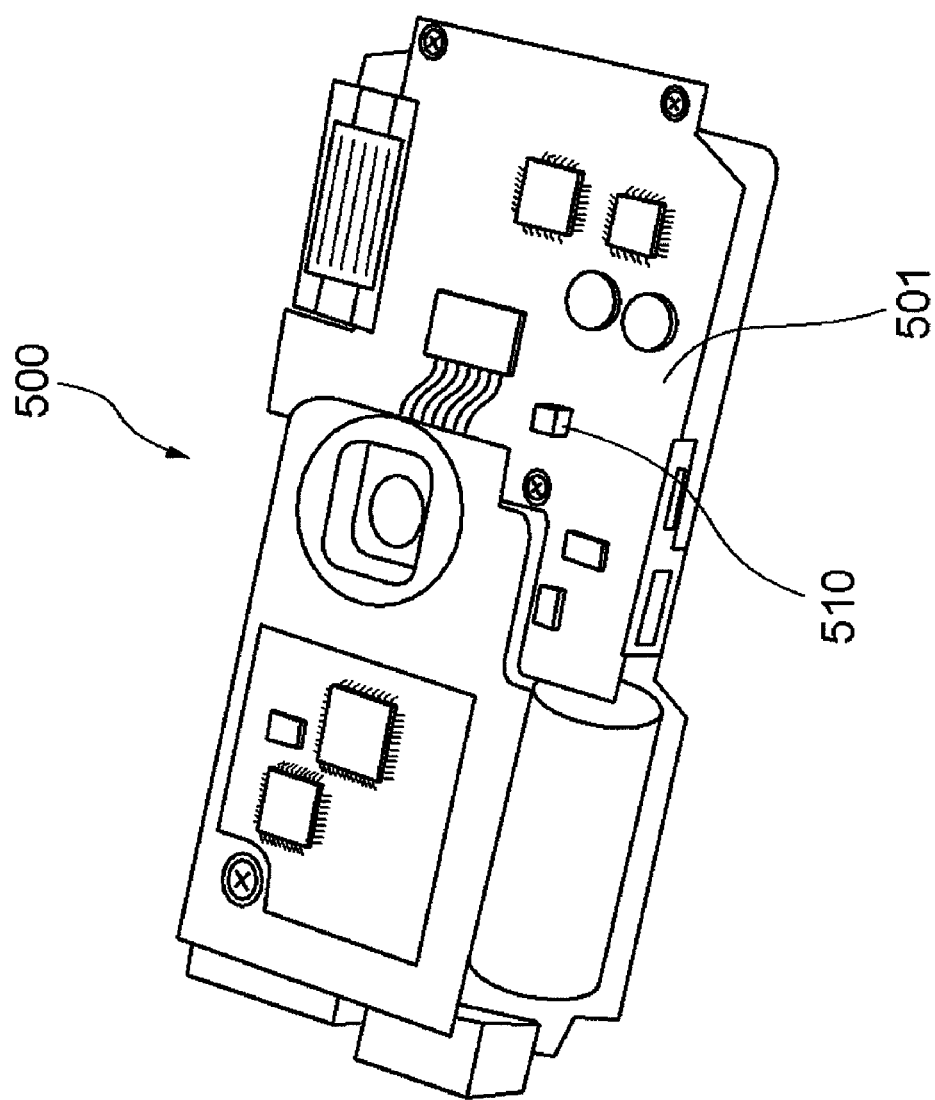
FIG. 18 is an illustration showing a structure of a camera to which a tilt angle sensor according to a seventh embodiment is loaded.

FIG. 18 is an illustration showing the internal structure of a camera 500. As shown in FIG. 18, a control substrate 501 for controlling actions of the camera is mounted inside the camera 500, and a tilt angle sensor 510 is loaded on the control substrate 501. Further, it is constituted to perform arithmetic processing on signals outputted from the sensor 510 by an arithmetic unit (not shown) provided on the control substrate 501 so as to measure the tilt angle in a prescribed direction (measuring device). This makes it possible to detect the tilt direction such as a longitudinal direction or a sideway direction at the time of pressing a shutter release. Therefore, the tilt angle sensor 510 can be utilized for image conversion, correction, and the like.

Further, the tilt angle sensor can be mounted to an electronic equipment such as a projector for measuring a tilt angle, so that it can be utilized for detecting a loaded state that indicates whether or not the projector is placed horizontally, etc. Furthermore, the tilt angle sensor can be mounted to a motorbike to detect a tilt angle of the motorbike so as to be utilized for detecting a fall down as well.

Further, the tilt angle sensor can also be utilized for measuring acceleration. That is, it is possible to measure the acceleration in a prescribed direction by performing arithmetic processing on output values of the tilt angle sensor in the above-described constitution, i.e. by performing arithmetic processing on the MR resistance values of the GMR elements. As a way of example, a case of mounting a tilt angle sensor 610 as an acceleration sensor to a hard disk drive 600 will be described by referring to FIG. 19.

Figure 19:
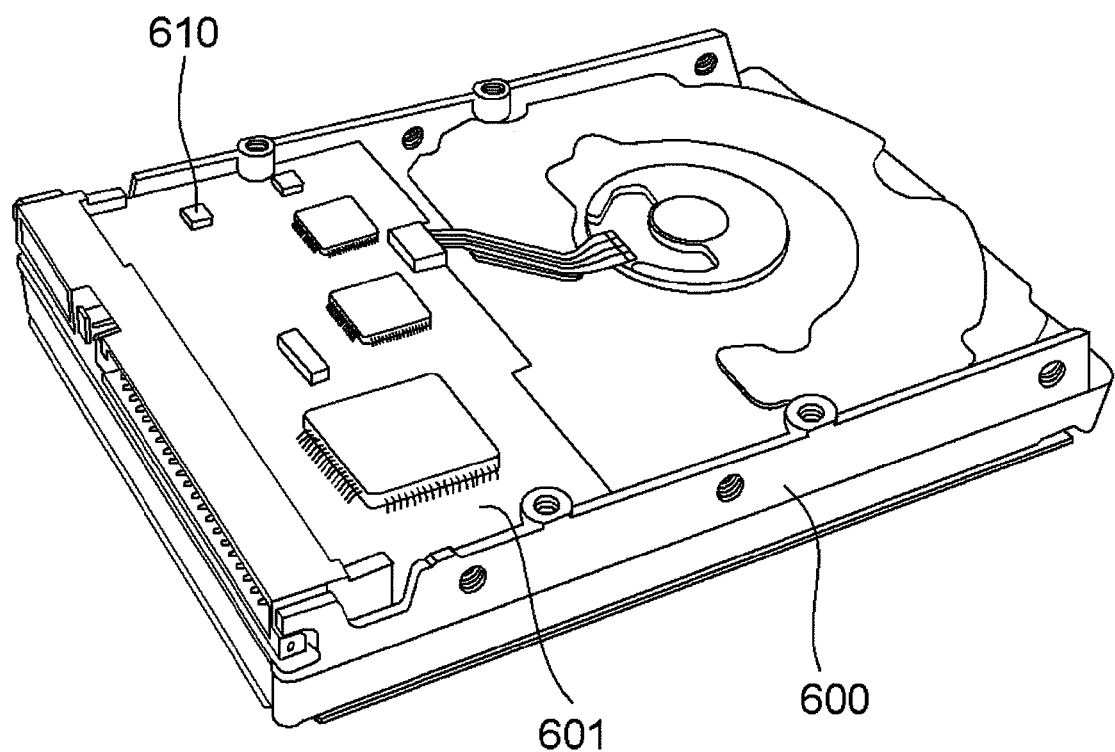
FIG. 19 is an illustration showing a structure of a hard disk drive to which the tilt angle sensor according to the seventh embodiment is loaded.

FIG. 19 shows the internal structure of the hard disk drive 600 viewed from the back side. A control substrate 601 for controlling actions of the drive is mounted inside the hard disk drive 600, and the tilt angle sensor 610 is loaded on the substrate 601. Further, it is constituted to perform arithmetic processing on signals outputted from the sensor 610 by an arithmetic unit (not shown) provided on the control substrate 601 so as to measure the tilt angle in a prescribed direction (measuring device). For example, it is possible to measure acceleration by calculating a change in a dynamic resistance value, i.e. by calculating a change amount in the resistance value per unit time. This makes it possible to suppress damages to data through employing a constitution for detecting forcible shifting or falling of the hard disk drive 600 instantly and performing a control to retract a magnetic head from the magnetic disk, etc.

Moreover, the above-described tilt angle sensor can be mounted to a controller of a game device. In such a case, an action (acceleration) and a tilt angle of the controller may be measured, and the measured values may be utilized as input values from the controller.

While it has been described in the above by referring to the case of mounting a single tilt angle sensor to an electronic equipment or the like, it is also possible to mount a plurality of tilt angle sensors for enabling measurements of the tilt angles or the accelerations in a plurality of directions. For example, two tilt angle sensors may be provided in such a manner that the respective spring members (suspension) are arranged to be orthogonal to each other. With this, the sensors can be utilized for detecting the tilt angles and the accelerations in two axial directions, i.e. in planar directions. Specifically, the sensors may be attached to a heater to prevent it from falling down, may be attached to a crane truck to detect a level state thereof, and the like.

Figure 20:
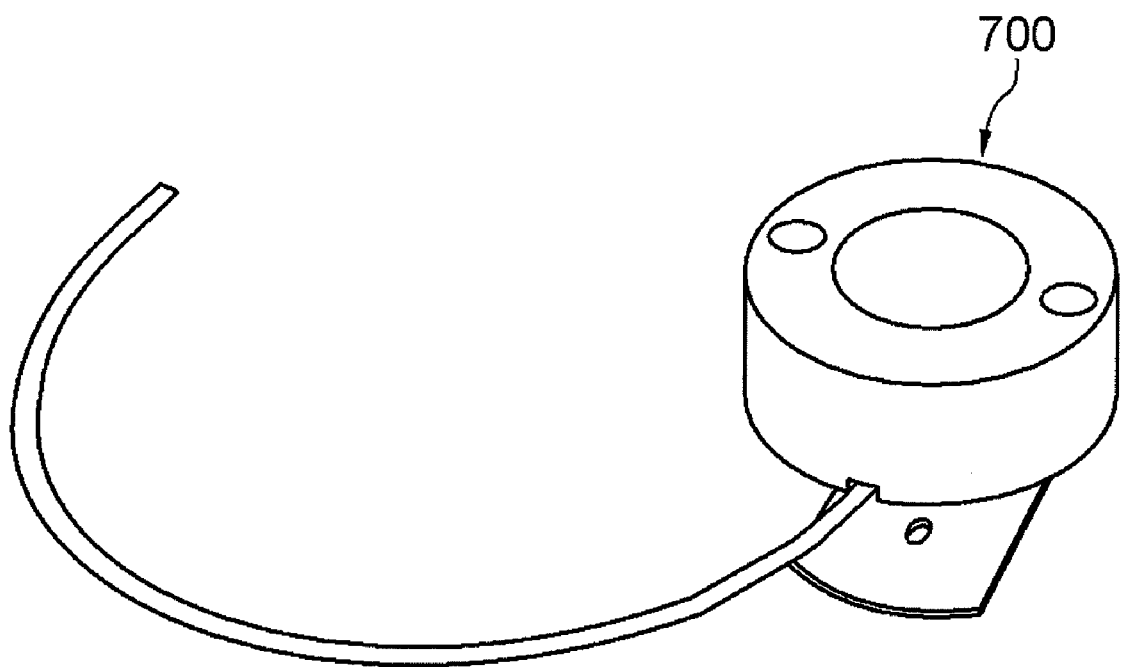
FIG. 20 an illustration showing a structure of a seismometer to which the tilt angle sensor according to the seventh embodiment is loaded.
Figure 21:
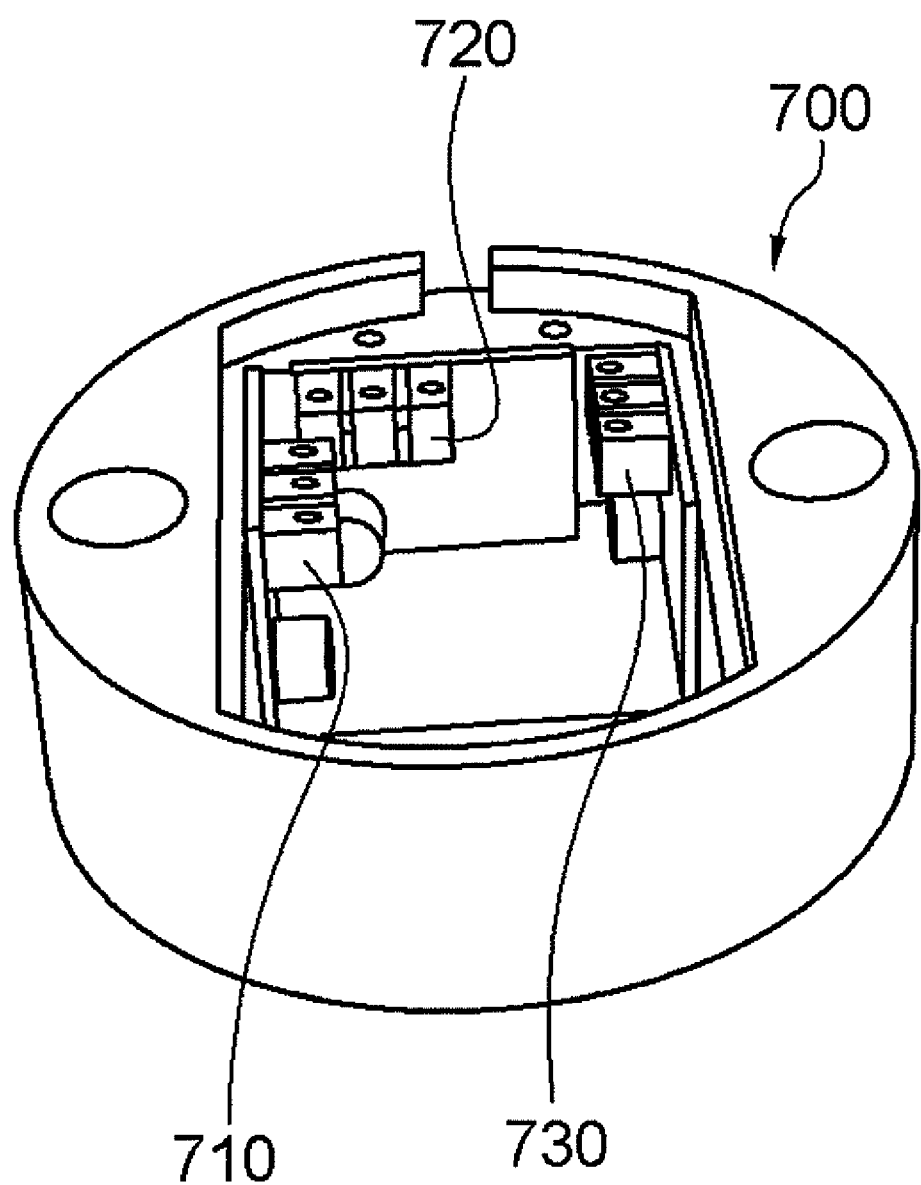
FIG. 21 is an illustration showing the internal structure of the seismometer to which the tilt angle sensor according to the seventh embodiment is loaded.

Furthermore, three tilt angle sensors may be provided in such a manner that the bending directions of each spring member (suspension) are directed in three axial directions (X-axis, Y-axis, and Z-axis directions) so as to enable detection of the tilt and acceleration three-dimensionally. Specifically, such case may be applied to a seismometer. An example of the structure of a seismometer 700 to which the above-described tilt angle sensors according to the present invention are mounted is illustrated in FIG. 20 and FIG. 21. FIG. 20 is an illustration showing an external appearance of the seismometer 700, and FIG. 21 is an illustration showing the inside of the main body of the seismometer 700. As shown in the drawings, three tilt angle sensors 710, 720, and 730 are provided inside the seismometer 700, and those are arranged in such a manner that the bending directions of each spring member (suspension) are directed in three axial direction, i.e. in horizontal X-direction, horizontal Y-direction, and vertical Z-direction. This makes it possible to detect generation of the acceleration and the tilt in three-dimensional directions caused by an earthquake with high sensitivity and high accuracy.

While various application examples of the tilt angle sensor have been disclosed above, the tilt angle sensor may be loaded on any kinds of electronic devices or other devices as well. The sensor can be utilized to protect the device itself by controlling the action of the electronic device when the sensor detects a prescribed acceleration or a tilt angle. With this, it becomes possible to constitute highly reliable electronic devices and other various devices, and to improve the functions of the devices at the same time.

The tilt angle sensor according to the present invention has an industrial applicability, since the tilt angle sensor can measure a tilt and acceleration of an electronic equipment or various other devices by being mounted to those devices.

What is claimed is:

1. A tilt angle sensor, comprising:
a spring member having a fixed end, and a free end that flexes so as to bend in at least one direction;
a magnetic field generator that generates a magnetic field, which is mounted at said free end of said spring member;
a magnetic field detector, that faces said magnetic field generator, that detects a direction of said magnetic field generated by said magnetic field generator; and
a damper that applies a damping force to a bending action of said spring member,
wherein said damper is provided near said free end of said spring member, and
said damper is one of provided at a far end part of said free end of said spring member and provided to said magnetic field generator.

2. The tilt angle sensor according to claim 1, wherein said damper includes one of said spring member and said magnetic field generator; a fixing member; and a viscous damper that damps a relative movement of said spring member and said fixing member.

3. The tilt angle sensor according to claim 2, wherein said viscous damper comprises a gel.

4. The tilt angle sensor according to claim 3, wherein said damper includes a gel-type housing part, provided at said fixing member, including said gel; and
a dipper that is a part of one of said spring member and said magnetic field generator dipped into said gel.

5. The tilt angle sensor according to claim 3, wherein said gel is not cured at temperatures in a range from −40 degrees Celsius to 120 degrees Celsius and has a viscosity in a predetermined range.

6. The tilt angle sensor according to claim 3, wherein said gel comprises a silicone gel.

7. The tilt angle sensor according to claim 1, wherein said spring member is formed with a thin plate in a bending direction of said free end.

8. A detection-target to which said tilt angle sensor of claim 1 is mounted, comprising
a measurer that measures one of a tilt angle and an acceleration of said detection-target in a bending direction of said spring member based on an output value from said tilt angle sensor.

9. The detection-target according to claim 8, wherein said detecting-target comprises an electronic equipment.

10. A tilt angle sensor, comprising:
a spring member having a fixed end and a free end that flexes so as to bend in at least one direction;
a magnetic field generator that generates a magnetic field, which is mounted at said free end of said spring member;
a magnetic field detector, that faces said magnetic field generator, that detects a direction of said magnetic field generated by said magnetic field generator; and
a damper that applies a damping force to a bending action of said spring member,
wherein said damper is provided near said free end of said spring member, and
wherein said damper is one of provided at a far end part of said free end of said spring member and provided to said magnetic field generator.

11. A tilt angle sensor, comprising:
a spring member having a fixed end and a free end that flexes so as to bend in at least one direction;
a magnetic field generator that generates a magnetic field, which is mounted at said free end of said spring member;
a magnetic field detector, that faces said magnetic field generator, that detects a direction of said magnetic field generated by said magnetic field generator; and
a damper that applies a damping force to a bending action of said spring member,
wherein said damper includes one of said spring member and said magnetic field generator; a fixing member; and a viscous damper that damps relative movement of said spring member and said fixing member.

12. The tilt angle sensor according to claim 11, wherein said viscous damper comprises a gel.

13. The tilt angle sensor according to claim 12, wherein said damper is constituted with: a gel-type housing part, provided at said fixing member, including said gel; and a dipper that is a part of one of said spring member and said magnetic field generator dipped into said gel.

14. The tilt angle sensor according to claim 12, wherein said gel is not cured at temperatures in a range from −40 degrees Celsius to 120 degrees Celsius and has a viscosity in a predetermined range.

15. The tilt angle sensor according to claim 12, wherein said gel comprises a silicone gel.

* * * * *